(12) United States Patent
Hanssen

(10) Patent No.: US 9,470,725 B2
(45) Date of Patent: Oct. 18, 2016

(54) MEASURING POWER CONSUMPTION OF CIRCUIT COMPONENT OPERATING IN ULTRA-LOW POWER MODE

(71) Applicant: Atmel Corporation, San Jose, CA (US)

(72) Inventor: Ingar Hanssen, Tiller (NO)

(73) Assignee: Atmel Corporation, San Jose, CA (US)

( * ) Notice: Subject to any disclaimer, the term of this patent is extended or adjusted under 35 U.S.C. 154(b) by 475 days.

(21) Appl. No.: 13/953,530

(22) Filed: Jul. 29, 2013

(65) Prior Publication Data

US 2015/0028887 A1   Jan. 29, 2015

(51) Int. Cl.
| | |
|---|---|
| *H02J 7/04* | (2006.01) |
| *G01R 21/00* | (2006.01) |
| *G01R 27/26* | (2006.01) |
| *G01R 31/30* | (2006.01) |
| *G01R 31/317* | (2006.01) |

(52) U.S. Cl.
CPC ......... *G01R 21/006* (2013.01); *G01R 27/2688* (2013.01); *G01R 31/3004* (2013.01); *G01R 31/31721* (2013.01)

(58) Field of Classification Search
CPC ............ G01R 21/006; G01R 27/2688; G01R 31/3004; G01R 31/31721; Y02T 10/7005; Y02T 90/121; Y02T 90/14; Y02T 10/7044; Y02T 10/7061; Y02T 10/7072; Y02T 90/16; Y02T 10/7011; Y02T 10/705; Y02T 10/7055; Y02T 10/7088; Y02T 10/725; Y02T 90/124; Y02T 90/127
See application file for complete search history.

(56) References Cited

U.S. PATENT DOCUMENTS

| | | |
|---|---|---|
| 4,528,503 A | 7/1985 | Cole |
| 6,268,710 B1 | 7/2001 | Koga |
| 6,798,250 B1 | 9/2004 | Wile |
| 2003/0206021 A1 | 11/2003 | Laletin |
| 2004/0246031 A1* | 12/2004 | Lourens ................. G01K 3/005 327/58 |
| 2005/0040810 A1 | 2/2005 | Poirier |
| 2007/0080696 A1 | 4/2007 | Kumar |
| 2009/0097285 A1* | 4/2009 | Cook ...................... H02M 3/07 363/60 |
| 2010/0225492 A1 | 9/2010 | Abdoulin |
| 2010/0250043 A1* | 9/2010 | Scheucher .......... B60L 11/1861 701/22 |
| 2010/0306737 A1 | 12/2010 | Hamilton, II |
| 2011/0074382 A1 | 3/2011 | Patel |
| 2011/0095728 A1* | 4/2011 | Chen ..................... H02J 7/0055 320/162 |
| 2011/0187329 A1 | 8/2011 | Majima |
| 2011/0204865 A1* | 8/2011 | Ye ......................... H02M 3/156 323/283 |
| 2012/0205258 A1 | 8/2012 | Noble |
| 2014/0062940 A1* | 3/2014 | Al-Dahle .............. G06F 3/0412 345/174 |
| 2014/0132337 A1* | 5/2014 | Yannette ................ G06F 21/75 327/534 |
| 2015/0028898 A1 | 1/2015 | Hanssen et al. |

\* cited by examiner

*Primary Examiner* — Arleen M Vazquez
*Assistant Examiner* — Alesa Allgood
(74) *Attorney, Agent, or Firm* — Fish & Richardson P.C.

(57) ABSTRACT

By powering an electronic component operating in an ultra-low power mode from a pre-charged measuring capacitor and measuring the time to discharge the capacitor to a trip voltage level, measurement data can be obtained. In some implementations, the capacitance of the capacitor can be obtained by adding a known current to the unknown current drawn from the capacitor and calculating the capacitance using a mathematical formula.

17 Claims, 4 Drawing Sheets

MEASURING POWER CONSUMPTION OF CIRCUIT COMPONENT OPERATING IN ULTRA-LOW POWER MODE

TECHNICAL FIELD

This disclosure relates generally to obtaining measurement data from circuit components.

BACKGROUND

Consumers continue to demand more functionality and higher performance in their battery-operated products, such as smart phones and electronic tablet computers. To maximize functionality and battery life, developers of these battery-powered applications must consider several factors in their system design. In these applications, the microcontroller is a primary power consumer and developers must carefully consider the way energy is used. In some cases, developers may need to measure ultra-low power consumption of the microcontroller while in sleep mode. Traditional solutions for measuring power consumption use external current measuring circuitry. It is difficult, however, to design measuring circuitry that can measure in the nanoamp (nA) range.

SUMMARY

By powering a circuit component operating in an ultra-low power mode from a pre-charged measuring capacitor and measuring the time to discharge the capacitor to a trip voltage level, measurement data can be obtained. In some implementations, the capacitance of the capacitor can be obtained by adding a known current to the unknown current drawn from the capacitor and calculating the capacitance using a mathematical formula.

In some implementations, a method of obtaining measurement data from a circuit component operating in an ultra-low power mode comprises: charging a capacitor to a voltage level using a voltage source of the circuit component in sleep mode; disconnecting the voltage source from an internal power system of the circuit component, enabling the capacitor to power the circuit component; responsive to the enabling, starting a counter; determining that a voltage across the capacitor exceeds a trip voltage; stopping the counter; and obtaining measurement data using output of the counter.

In some implementations, the method further comprises: prior to charging the measuring capacitor, applying a known current to the capacitor for a period of time using a current sink; obtaining a calibration factor; and obtaining measurement data using the output of the counter and the calibration factor.

Particular implementations disclosed herein provide one or more of the following advantages: 1) current measuring circuitry can be built into a circuit component without a need for external current measuring circuitry; and 2) the current measurements can be made with a resolution in the nA range.

DETAILED DESCRIPTION

Figure 1:
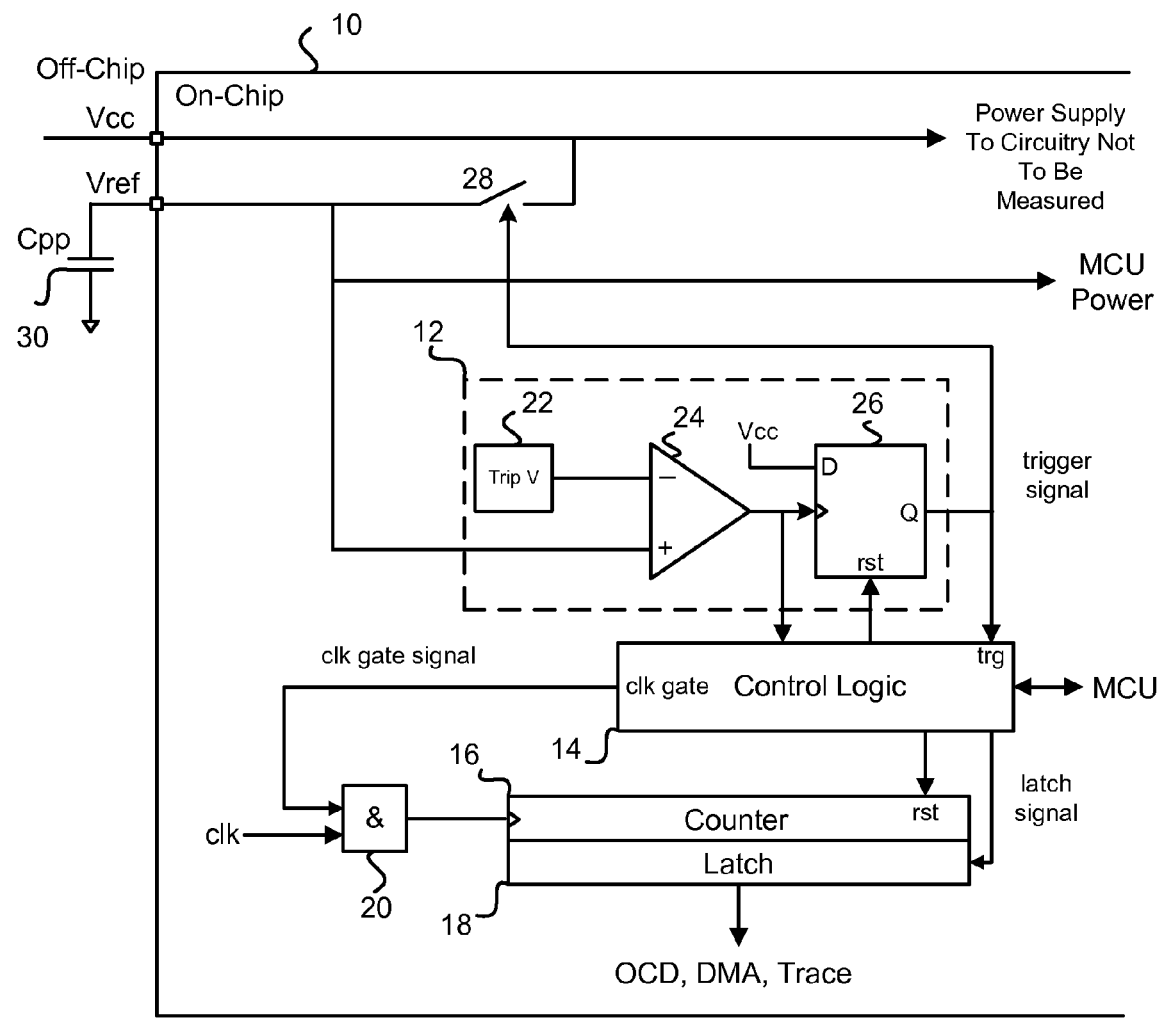
FIG. 1 is a circuit diagram of an example circuit for measuring ultra-low power consumption of a circuit component.

FIG. 1 is a circuit diagram of an example circuit 10 for measuring ultra-low power consumption of a circuit component. Circuit 10 can be an integrated circuit (IC) that includes a component for which ultra-low power consumption is to be measured. In some implementations, circuit 10 can include discrete components.

In the example shown, the circuit component is a microcontroller unit (MCU). In some implementations, circuit 10 includes measuring circuit 12, control logic 14, counter 16, latch 18 and logic device 20. Measuring circuit 12 can include trip voltage 22, comparator 24 and latch 26.

Latch 26 output controls switch 28. Switch 28 is coupled to measuring capacitor 30, the positive terminal of comparator 24 and an MCU power domain. Control logic 14 provides a clock gate signal (clk gate signal), which is input with a clock (clk) into logic device 20. In this example, logic device 20 is an AND gate. Other suitable combinatorial or sequential logic can also be used as clock gating logic.

The output of logic device 20 is input into counter 16. In response to the clock gate being logic high, clock counter 16 increments (or decrements) by one (or more) for each positive edge of a clock pulse. Latch 18 receives a latch signal from control logic 14, which causes the count of counter 16 to be latched in latch 18.

Comparator 24 has two inputs coupled to trip voltage 22 and measuring capacitor 30, respectively. Trip voltage 22 can be some percentage of the power supply voltage (Vcc) (e.g., 95% of Vcc). Measuring capacitor 30 can be coupled to a pin (Vref) of circuit 10. The capacitance of Cpp can be known or determined as described in reference to FIGS. 3 and 4.

Control logic 14 resets latch 26 and counter 16. Control logic 14 and switch 28 receive a trigger signal from the output of latch 26. Latch 26 can be a "D" flip-flop configured to latch the output of comparator 24.

Figure 2:
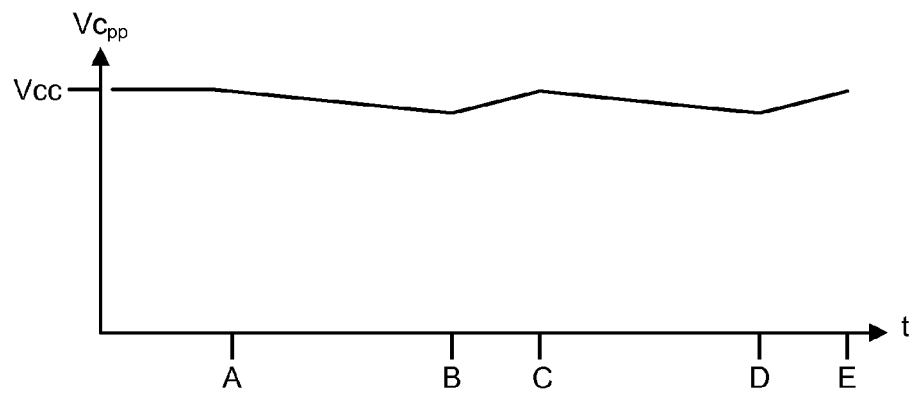
FIG. 2 is a timing diagram illustrating time points during the measuring of ultra-low power consumption of a circuit component.

FIG. 2 is a timing diagram illustrating time points during the measuring of ultra-low power consumption of a circuit component. Control logic 14 controls the obtainment of measurement data while the component operates in an ultra-low power mode (e.g., in a sleep mode) by running a measurement sequence, which can be implemented as a state machine in control logic 14.

In some implementations, the measurement sequence begins by charging measurement capacitor 30 to supply voltage Vcc and then opening switch 28 to disconnect Vcc from an internal power system in the MCU (not shown), leaving the MCU powered solely by measuring capacitor 30. These events correspond to time points A, C and E in FIG. 2.

Counter 16 is started when control logic 14 generates a clock gate signal, which is input into logic device 20, together with a fixed frequency clock signal (Clk). The voltage across measuring capacitor 30 ($Vc_{pp}$) is monitored by using comparator 24 to compare $Vc_{pp}$ with trip voltage 22 (Vtrp).

Comparator 24 triggers when the capacitor voltage $Vc_{pp}$ exceeds (e.g., drops below) Vtrp and the voltage level at the output of comparator 24 changes (e.g., goes high). The period of time beginning when counter 16 starts counting to the time when counter 16 stops counting is referred to as the discharge period. If the circuit component (e.g., MCU) wakes up during the discharge period and starts consuming current, the measurement sequence can be aborted by control logic 14 and switch 24 closed immediately. When comparator 24 triggers, counter 16 is stopped by turning off the clock gate signal. Switch 28 is then closed, causing measuring capacitor 30 to be re-connected to Vcc and recharged. This event corresponds to time points B and D in FIG. 2.

Measurement data (e.g., discharge time) can be saved by latching the data into latch 18 and then signaling an on-chip or off-chip debug or trace system (e.g., a personal computer) to process the measurement data, or accumulate the measurement data if a repetition of the measurement sequence is required. If a repetition of the measurement sequence is required (e.g., a "free running mode") switch 28 can be left closed for a delay period that is sufficient to charge measuring capacitor 30 fully to Vcc. This corresponds to a time point between time points B and C. After the delay period, switch 28 is opened and the measurement sequence steps are repeated as described above.

For increased usability, a calibration step can be run prior to the measurement sequence by coupling a fixed load calibration current sink 32 (FIG. 3) to measuring capacitor 30. By assuming that measuring capacitor 30 and Vcc are constant and applying a known current $\Delta I$ from current sink 32, the product $C*\Delta V$ can be determined using the formula given by $$C*\Delta V = \Delta t * \Delta I \quad [1]$$

where C is the capacitance of measuring capacitor 30, $\Delta V$ is the difference between Vcc and Vtrp, $\Delta I$ is the fixed load calibration current and $\Delta t$ is the measured time.

The routing of the internal power domains in the MCU can be configured such that the measurement circuitry is not loading other components in circuit 10 that are not being measured (components other than the MCU).

Some example power consumption calculations are as follows. In an ideal system, a 100 nF capacitor connected to a 1 µA consumer will drop by 100 mV in 10 msec. This will correspond to a measurement result of 328 counts if the clock signal (clk) frequency is 32768 Hz. For 10 µA consumption, the count is 32. For 0.1 µA consumption, the count is 3276. These counts can be stored in latch 18, where the count can be sent to or retrieved by a debugging system, such as an on-chip debug (OCD) system (e.g., a personal computer), an on-chip buffer using, for example, direct memory access (DMA) or a trace system. For example, an OCD system can calculate a discharge time t using the count and the known clock frequency, calculate current I using [1] and then calculate power (e.g., milliwatts or microwatts) using $$P = V*I. \quad [2]$$

For a system with a Cpp of 100 nF and an internal resistance of 100 ohm in the path between Vcc and Cpp, the recharging time in the last step of the measurement sequence is defined by the resistor-capacitor (RC) time constant, which in this case is 10 µsec. The product 5*RC time gives 50 µsec which corresponds to less than 2 cycles of a 32 kHz clock. The 5*RC product is to ensure full recharging of Cpp back to Vcc level.

Figure 3:
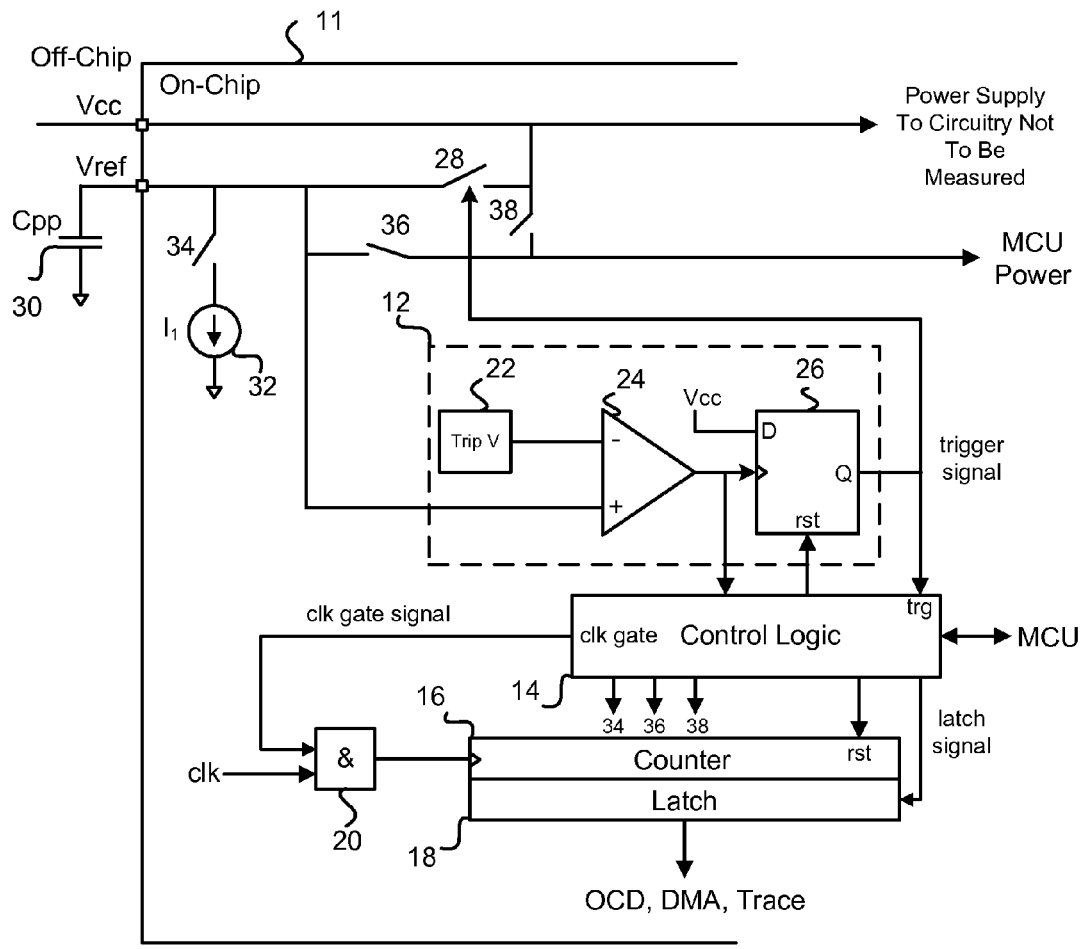
FIG. 3 is a circuit diagram illustrating the circuit of FIG. 1 with additional circuitry for measuring a capacitance of a measuring capacitor.

FIG. 3 is a circuit diagram illustrating the circuit of FIG. 1 with additional circuitry for measuring a capacitance of a measuring capacitor. Circuit 11 includes additional switches 34, 36 and 38, which are controlled by control logic 14. The addition of switches 34, 36 and 38 allows the capacitance of measuring capacitor 30 to be obtained. By adding a known current to an unknown current drawn from measuring capacitor 30 of unknown capacitance C, the capacitance C can be calculated. For small changes in the voltage over measuring capacitor 30, a linear discharge curve can be assumed. A small change is in the range of 5-10% of the initial voltage (e.g., Vcc).

Figure 4:
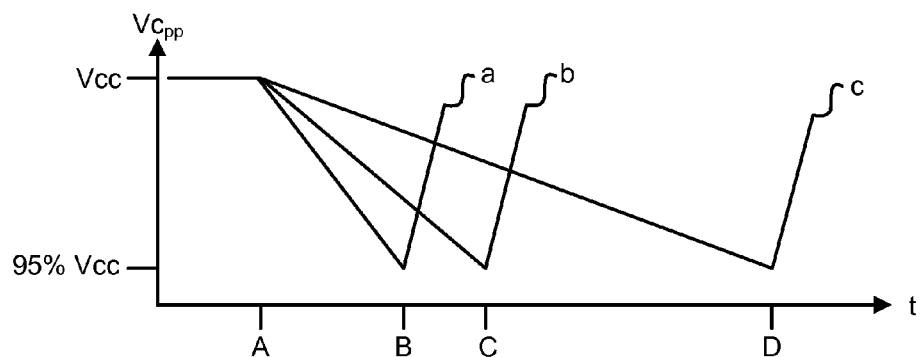
FIG. 4 is a timing diagram illustrating time points during the measuring of capacitance of the measuring capacitor.

FIG. 4 is a timing diagram illustrating time points during the measuring of capacitance of the measuring capacitor. The calibration sequence can begin by measuring the sleep mode current as previously described in reference to FIG. 2. During this step, the circuit component is in an ultra-low power mode (e.g., a sleep mode), switch 36 is closed and switches 28, 38 are open, which results in the circuit configuration shown in FIG. 2. With this circuit configuration, measuring capacitor 30 discharges to the trip voltage (e.g., 95% of Vcc). At the end of the discharge period, the time used to discharge the capacitor $t_1$ is stored together with the change of voltage $\Delta V$ during the discharge period. Curve b in FIG. 4 illustrates the discharge period in sleep mode with switches 34, 38 open and switch 36 closed.

During the next step of the calibration sequence, calibration current sink 32 is coupled to measuring capacitor 30 by closing switch 34. The resulting current flowing out of measuring capacitor 30 is the sum of the unknown current flowing into the circuit and the known current flowing into calibration current sink 32. The size of the additional current is $\Delta I$. The measurement sequence is repeated, resulting in a new discharge time $t_2$. The difference between $t_1$ and $t_2$ or $\Delta t = t_2 - t_1$ is calculated and stored. Curve a in FIG. 4 illustrates measuring unknown current in sleep mode plus additional known current with switch 38 open and switches 34, 36 closed.

The formula to calculate the capacitance C of measuring capacitor 30 is given by $$C = \Delta I \frac{\Delta t}{\Delta V}. \quad [3]$$

An example calculation given $\Delta I=1$ µA, $\Delta V=100$ mV, $\Delta t=10$ msec, and applying [3] is given by $$C = 1 \text{ µA} \frac{10 \text{ msec}}{10 \text{ mV}} = 0.1 \text{ µF}.$$

In a next step, the calibration current sink 32 is disconnected by opening switch 34 and the rest of the circuit is disconnected by opening switch 36 and closing switch 38. In this circuit configuration, only measurement circuit 12 is coupled to measuring capacitor 30 and the total discharge current is equal to the sum of the self-discharge current in the measuring capacitor 30 and pin out leakage current. A measurement of the discharge period is repeated and the result is stored as $t_0$ (time-point D). Curve C in FIG. 4 illustrates capacitor self-discharge plus leakage current in the port pin with switches 28, 36 and 38 open.

The resulting measurement $t_0$ can be calculated to a zero-current; the offset in the curve. An example calculation given pin out leakage=10 nA, self-discharge (3.3 GΩ, 3v3) =1 nA, total=11 nA and applying [3] is given by $$t_o = 1\ \mu F \frac{10\ mV}{11\ nA} = 0.91\ sec.$$

Figure 5:
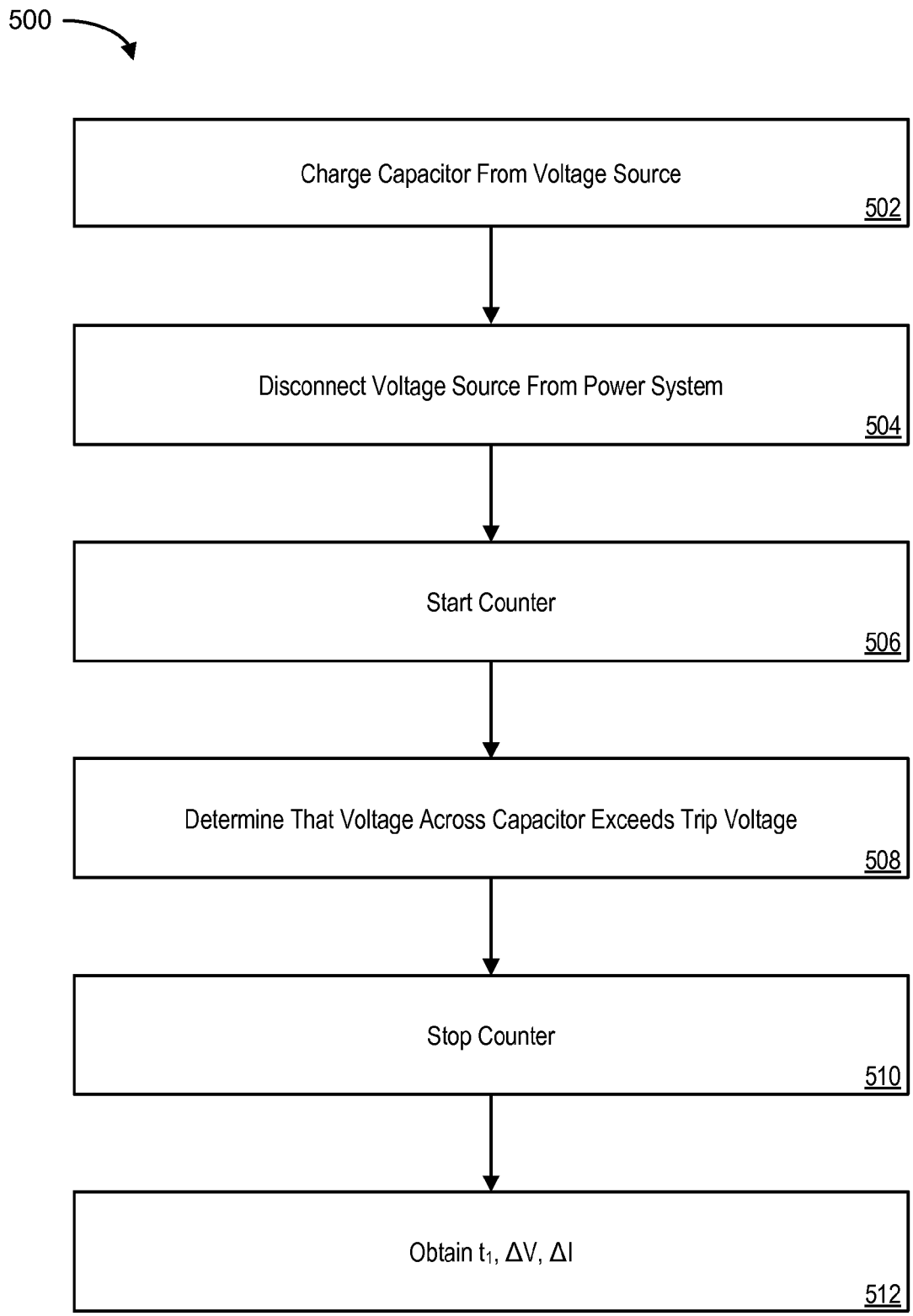
FIG. 5 is a flow diagram illustrating an example process of measuring ultra-low power consumption of a circuit component.

FIG. 5 is a flow diagram illustrating an example process 500 of obtaining measurement data from a circuit component operating in an ultra-low power mode. Process 500 can be performed by circuit 10 shown in FIG. 1 or circuit 11 shown in FIG. 3.

In some implementations, process 500 includes the steps of: charging a measuring capacitor from a voltage source (502); disconnecting the voltage source (504); starting a counter (506); determining that the voltage across the capacitor exceeds a trip voltage (508); stopping the counter (510) and obtaining and storing measurement data, including a discharge time and a corresponding change in voltage across the measuring capacitor and change in current drawn from the measuring capacitor. The measurement data can be calculated (512) using well-known mathematical formulas, such as formulas [1]-[3]. The trip voltage Vtrp can be set equal to a fraction of the supply voltage Vcc (e.g., 95% of Vcc or a fixed voltage of, e.g., Vcc-100 mV).

Figure 6:
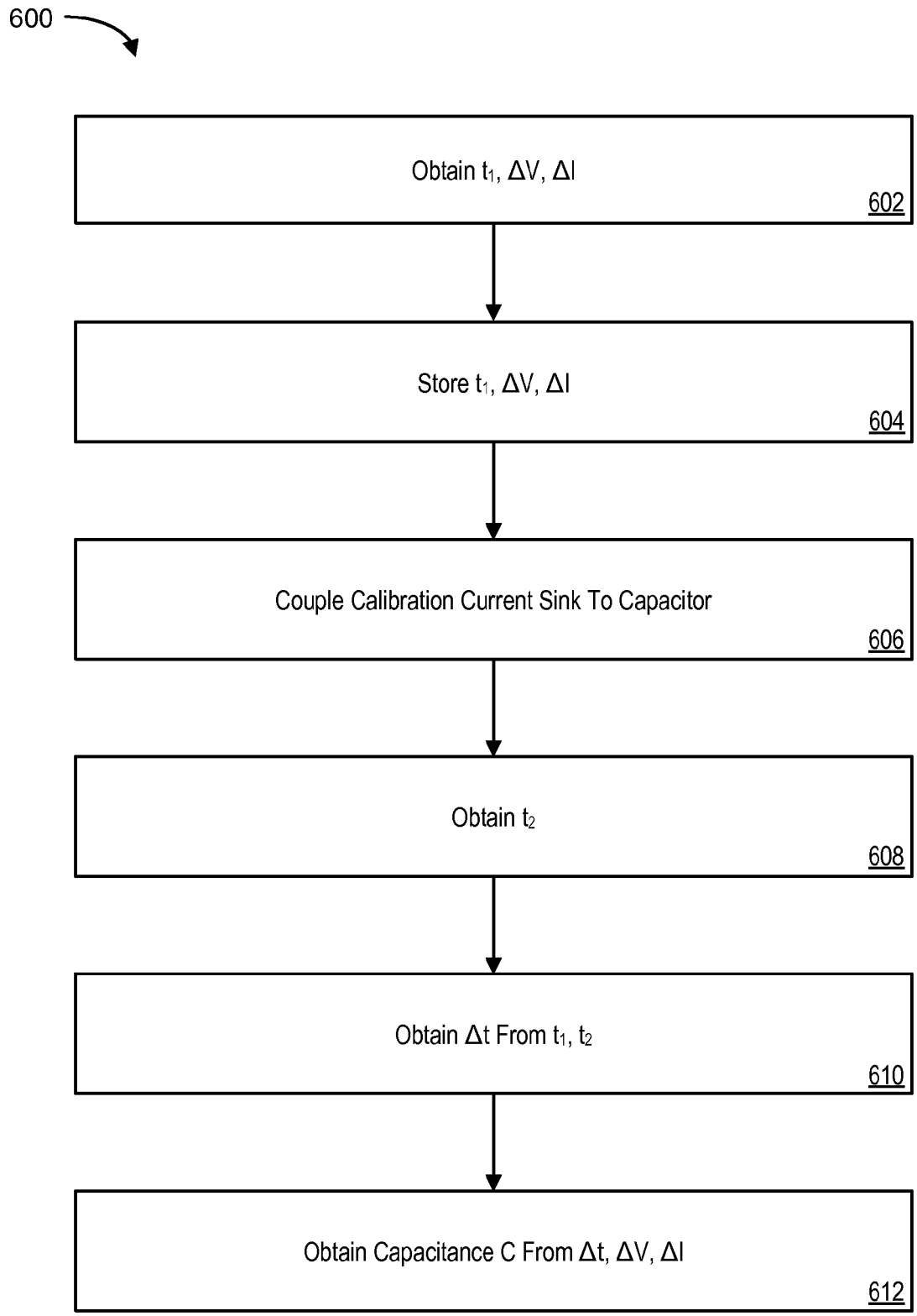
FIG. 6 is a flow diagram illustrating an example process of measuring capacitance of a measuring capacitor.

FIG. 6 is a flow diagram illustrating an example process 600 of measuring capacitance of a measuring capacitor. Process 600 can be performed by circuit 11 shown in FIG. 3.

In some implementations, process 600 includes the steps of: obtaining measurement data, including a first discharge time ($t_1$), a corresponding change in voltage ($\Delta V$) and a corresponding change in current ($\Delta I$) (602); storing the measurement data (604); coupling a current sink to the measuring capacitor (606); obtaining a second discharge time ($t_2$) (608); obtaining a time difference between the first and second discharge times ($\Delta t$) (610); and obtaining a capacitance (C) for the measuring capacitor using the stored measurement data and the obtained time difference (612).

The steps described above in reference to FIGS. 5 and 6 can be implemented using switches (e.g., transistors configured as switches) and control logic, as described in reference to FIGS. 1 and 3. In some implementations, the control logic can be implemented using a state machine. In other implementations, the control logic can be implemented by a microprocessor that executes firmware or software instructions to generate control signals for opening and closing the switches. The counter can be implemented using flip-flops and combination logic according to well-known digital design techniques (e.g., up/down counter). Some of the steps can be performed on-chip by an OCD or off-chip by a trace system or other debugging/testing system.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method of obtaining measurement data for a circuit component, the method comprising:
   charging a capacitor to a voltage level using a power system of the circuit component;
   disconnecting, by a control logic that is distinct from the circuit component, the power system of the circuit component, and enabling the capacitor to discharge and to power the circuit component;
   responsive to the enabling,
      starting a counter;
      stopping the counter when the capacitor has discharged to a trip voltage; and
      obtaining measurement data for the circuit component, comprising obtaining, using a value measured by the counter, a discharge time of the capacitor.

2. The method of claim 1, where the trip voltage is calculated from a product of the voltage level and a fixed constant.

3. The method of claim 1, further comprising:
   comparing a voltage across the capacitor with the trip voltage; and
   generating a trip signal when the voltage across the capacitor is less than or equal to the trip voltage.

4. The method of claim 1, further comprising:
   determining that the circuit component has transitioned out of an ultra-low power mode; and
   reconnecting the capacitor to the power system.

5. The method of claim 1, where the circuit component is a microcontroller.

6. The method of claim 1, further comprising:
   storing measurement data for a discharge period; and
   enabling access to the measurement data by another component or application.

7. The method of claim 1, wherein the value measured by the counter includes a time period for which the capacitor is discharged.

8. The method of claim 1, further comprising:
   prior to charging the capacitor,
      applying a known current to the capacitor for a period of time using a current sink;
      determining a calibration factor using the known current and the period of time; and
      obtaining the measurement data for the circuit component using the value measured by the counter and the calibration factor.

9. The method of claim 8, where the calibration factor is given by $C\Delta V = \Delta I * \Delta t$ where C is the capacitance of the capacitor, $\Delta V$ is the voltage across the capacitor, $\Delta I$ is the known current and $\Delta t$ is the time period.

10. A circuit for obtaining measurement data from a circuit component, comprising:
    a capacitor coupled to a power system of the circuit component;
    control logic distinct from the circuit component and configured to disconnect the power system of the circuit component to enable the capacitor to discharge and to power the circuit component; and
    a counter coupled to the control logic and configured to determine a discharge period.

11. The circuit of claim 10, where the circuit component is a microcontroller.

12. The circuit of claim 10, further comprising:
a comparator having inputs coupled to the capacitor and a trip voltage and an output coupled to the control logic, the comparator configured to compare a voltage across the capacitor and the trip voltage and to generate a trip signal based on the comparing.

13. The circuit of claim 12, further comprising:
a clock coupled to the control logic and the counter, the clock configured to start and stop the counter using a clock gate signal generated by the control logic.

14. The circuit of claim 12, further comprising:
a switch configured to selectively couple the power system to the capacitor; and
a first latch having an input coupled to the output of the comparator and an output coupled to the switch, the first latch configured to selectively open and close the switch in response to the trip signal.

15. The circuit of claim 14, further comprising:
a second latch configured for latching the output of the counter.

16. The circuit of claim 12, further comprising:
a current sink configured to apply a known current to the capacitor for a period of time to allow a calibration factor to be obtained.

17. The circuit of claim 16, where the calibration factor is given by $$C\Delta V = \Delta I * \Delta t$$

where C is the capacitance of the capacitor, $\Delta V$ is the voltage across the capacitor, $\Delta I$ is the known current and $\Delta t$ is the time period.

* * * * *